US012561499B1

(12) United States Patent
Mehta

(10) Patent No.: US 12,561,499 B1
(45) Date of Patent: Feb. 24, 2026

(54) AI-BASED 3-D COMPUTER-AIDED DESIGN MERGING

(71) Applicant: Lumex.online DMCC, Dubai (AE)

(72) Inventor: Vishal Mehta, Dubai (AE)

(73) Assignee: Lumex.online DMCC, Dubai (AE)

( * ) Notice: Subject to any disclaimer, the term of this patent is extended or adjusted under 35 U.S.C. 154(b) by 0 days.

(21) Appl. No.: 18/984,832

(22) Filed: Dec. 17, 2024

(51) Int. Cl.
| | |
|---|---|
| *G06F 30/27* | (2020.01) |
| *B33Y 50/02* | (2015.01) |
| *G06T 17/20* | (2006.01) |

(52) U.S. Cl.
CPC .............. *G06F 30/27* (2020.01); *B33Y 50/02* (2014.12); *G06T 17/20* (2013.01)

(58) Field of Classification Search
CPC ...................................................... G06F 30/27
USPC ............................................................ 703/2
See application file for complete search history.

(56) References Cited

U.S. PATENT DOCUMENTS

| | | | | |
|---|---|---|---|---|
| 10,204,446 | B2 * | 2/2019 | Schmidt ................... | G06T 19/20 |
| 2014/0379119 | A1 * | 12/2014 | Sciacchitano ...... | G05B 19/4099 |
| | | | | 700/182 |
| 2015/0321427 | A1 * | 11/2015 | Gunnarsson ....... | G05B 19/4099 |
| | | | | 700/98 |
| 2017/0301133 | A1 * | 10/2017 | Min ...................... | G06T 15/503 |
| 2022/0215145 | A1 * | 7/2022 | Krishnaswamy ....... | G06T 17/20 |

OTHER PUBLICATIONS

LS_SIM_2014 (Combining Two Assembly Files to Form a Complete Assembly, Downloaded from Youtube Sep. 11, 2014) (Year: 2014).*
STL_Files_2022 (How to Create High Quality STIL Files for 3D Prints, downloaded from the Wayback Machine Jun. 29, 2021) (Year: 2021).*
Hnhia_Ho_2011 (Finding Optimal Rotation and Translation Between Corresponding 3D Points, Downloaded from the Wayback Machine Oct. 3, 2024) (Year: 2024).*
Lect5_2011 (CSE 554 Lecture 5: Alignment, Washington University in St. Louis, Science of Engineering & Applied Science, 2011) (Year: 2011).*

* cited by examiner

*Primary Examiner* — Brian S Cook
(74) *Attorney, Agent, or Firm* — Jones Day

(57) ABSTRACT

Two or more files that each encapsulate a three dimensional (3-D), computer-aided design (CAD) of a different object are received, and each of the representations further include a mesh of objects. After the two or more files are received, key features within each of the files are extracted and then isolated in order to enable targeted operations to be applied to the extracted key features. The now-isolated key features from each of the files are then positioned and aligned with the isolated key features of another of the files. By merging the positioned and aligned features, a mesh object can be generated that is based on at least two of the files. The newly generated mesh object can then be provided to a consuming application or process. Related apparatus, systems, techniques and articles are also described.

25 Claims, 5 Drawing Sheets

200

300

400

AI-BASED 3-D COMPUTER-AIDED DESIGN MERGING

TECHNICAL FIELD

The subject matter described herein relates to techniques for merging or otherwise combining three dimensional (3-D) computer-aided design (CAD) files by leveraging artificial intelligence (AI).

BACKGROUND

In various fields such as product design, prototyping, and 3-D printing, the need to combine multiple, virtual 3-D models is prevalent. Traditional methods of combining 3-D models (which are stored as digital files) often involve manual manipulation using CAD software, a process that can be time-consuming, inaccessible, inefficient, require unnecessary computing resources, and require significant expertise.

SUMMARY

In a first aspect, two or more files that each encapsulate a three dimensional (3-D), computer-aided design (CAD) of a different object are received, and each of the representations further include a mesh of objects. After the two or more files are received, key features within each of the files are extracted and then isolated in order to enable targeted operations to be applied to the extracted key features. The now-isolated key features from each of the files are then positioned and aligned with the isolated key features of another of the files. By merging the positioned and aligned features, a mesh object can be generated that is based on at least two of the files. The newly generated mesh object can then be provided to a consuming application or process.

Each of the two or more files can be converted into one or more mesh data objects prior to extracting and isolating the features of interest from each of the files. The mesh data objects can store geometric information characterizing vertices, edges, and faces in a structured format. Features that are not of interest are not extracted from the two or more files.

Isolated key features can be categorized as being associated with a particular design element. This can allow features from the same category in each file to be positioned and aligned with each other.

Positioning and aligning the isolated key features can further include calculating centroids of at least two of the features that were extracted from the files. Based on one or more of the distances between the centroids that were calculated, a translation vector can be generated. The translation vector can be used to align features in at least one the files with those of another file. Positioning and aligning the isolated key features can also cause two or more features that were extracted to be rotated in order to align the orientations of those features with each other. Two or more of the extracted features can also be aligned through a combination of both translation and rotation. The intersection of two or more features can also be prevented prior to and following their alignment.

Generation of the mesh object can include performing at least one structural integrity operation prior to merging two or more of the positioned and aligned features. This helps to ensure that the resulting mesh object will be free from defects. One or more of the structural integrity operations can merge vertices and/or fill small gaps within the positioned and aligned features so that the mesh object that is subsequently generated is watertight.

Generation of the mesh object can include smoothing transitions between components of the mesh object. These components include sets of the key features that are positioned and aligned.

The consuming application or process can load the generated mesh object into memory, store the generated mesh object in physical persistence, transmit the generated mesh object over a computing network to a remote computing device, and/or cause the generated mesh object to be displayed in a graphical user interface of a computer-aided design software program.

A physical object can be manufactured that is based upon the mesh object that was generated. This manufacturing can be performed by an additive manufacturing system.

Non-transitory computer program products (i.e., physically embodied computer program products) are also described that store instructions, which when executed by one or more data processors of one or more computing systems, cause at least one data processor to perform operations herein. Similarly, computer systems are also described that may include one or more data processors (e.g., hardware processors) and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The subject matter described herein provides many technical advantages. For example, the current subject matter provides enhanced and automated techniques for merging two designs into a single model in an efficient, accurate, and accessible manner facilitating various 3-D design tasks. Such techniques can be used for different use cases including, for example, preparing and repairing models to ensure they are watertight and error-free prior to 3-D printing, performing transformations, Boolean operations, and custom modeling tasks for Computer-Aided Design (CAD), calculating geometric properties like volume and surface area for physical simulations, and aligning, combining, and exporting 3-D assets for use in game engines.

The details of one or more variations of the subject matter described herein are set forth in the accompanying drawings and the description below. Other features and advantages of the subject matter described herein will be apparent from the description and drawings, and from the claims.

DETAILED DESCRIPTION

Figure 1:
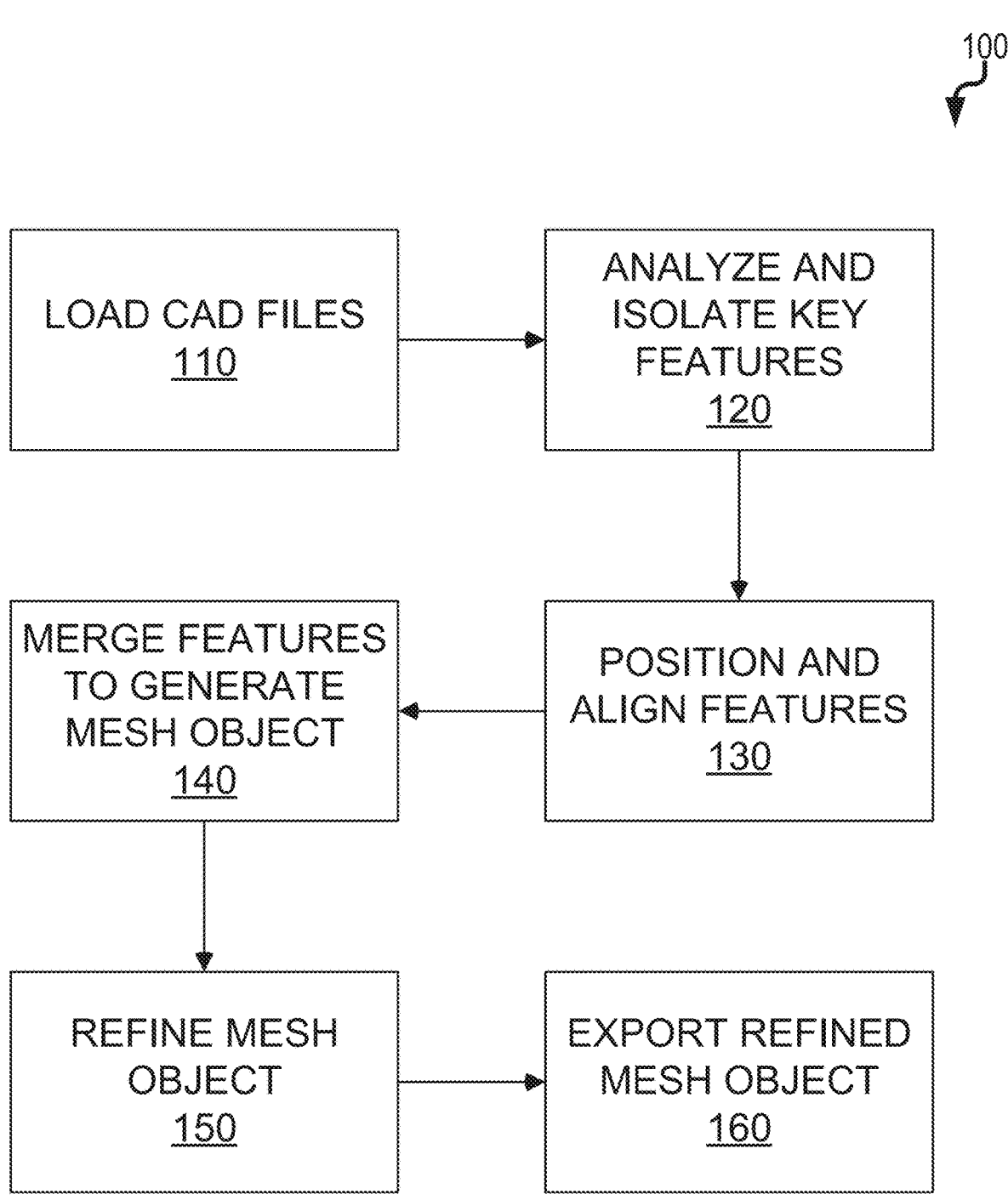
FIG. 1 is a process flow diagram illustrating an example workflow for merging multiple, 3-D CAD files.

FIG. 1 depicts process flow diagram 100 which details various operations that can be executed by a script (e.g., an AI script, etc.) on a local computing device, remote computing device, platform-as-a-service, etc. Initially, prior to step 110, the plurality of 3-D models to be merged together are stored within and characterized by a plurality of CAD files, wherein each 3-D model is represented by at least one CAD file. The script is configured to load 3-D models from various file formats, such as STL, OBJ, PLY, and others. The CAD files can include or otherwise be stereolithography (STL) files, which represent the surface geometry of a 3-D model using a series of connected triangles and/or polygons that encapsulate the shape of the model. STL files can be in an ASCII format, which stores mesh data in human-readable format but requires a larger file size, and/or a binary format, which requires a smaller file size that is more efficient for storage and transmission, but can be more difficult to edit.

Initially, at 110, the script is executed so that the plurality of CAD files are loaded. The CAD files can be loaded from different sources such as Python libraries such as numpy-stl and meshio, as well as 3-D modeling programs such as Blender and MeshLab, for example. Once the CAD files are loaded, the files are then converted into 3-D mesh objects having a standardized and/or harmonized format. This conversion involves reading the file format of each CAD file and parsing it into a data structure that can be manipulated programmatically. The standardized mesh objects store the vertices, edges, faces, and/or other geometric properties available for each of the loaded 3-D models. Once converted into standardized mesh objects, the 3-D models become fully accessible and manipulatable, ready for subsequent steps. The script can be configured such that after merging the plurality of 3-D models, the resultant model can be exported back into any of the original file formats of the plurality of 3-D models, thus ensuring reciprocal compatibility with other software and tools. It should be noted that, while certain aspects are described as being implemented by a script leveraging a library, other software and services can also provide the same functionality depending on the desired implementation.

Figure 2:
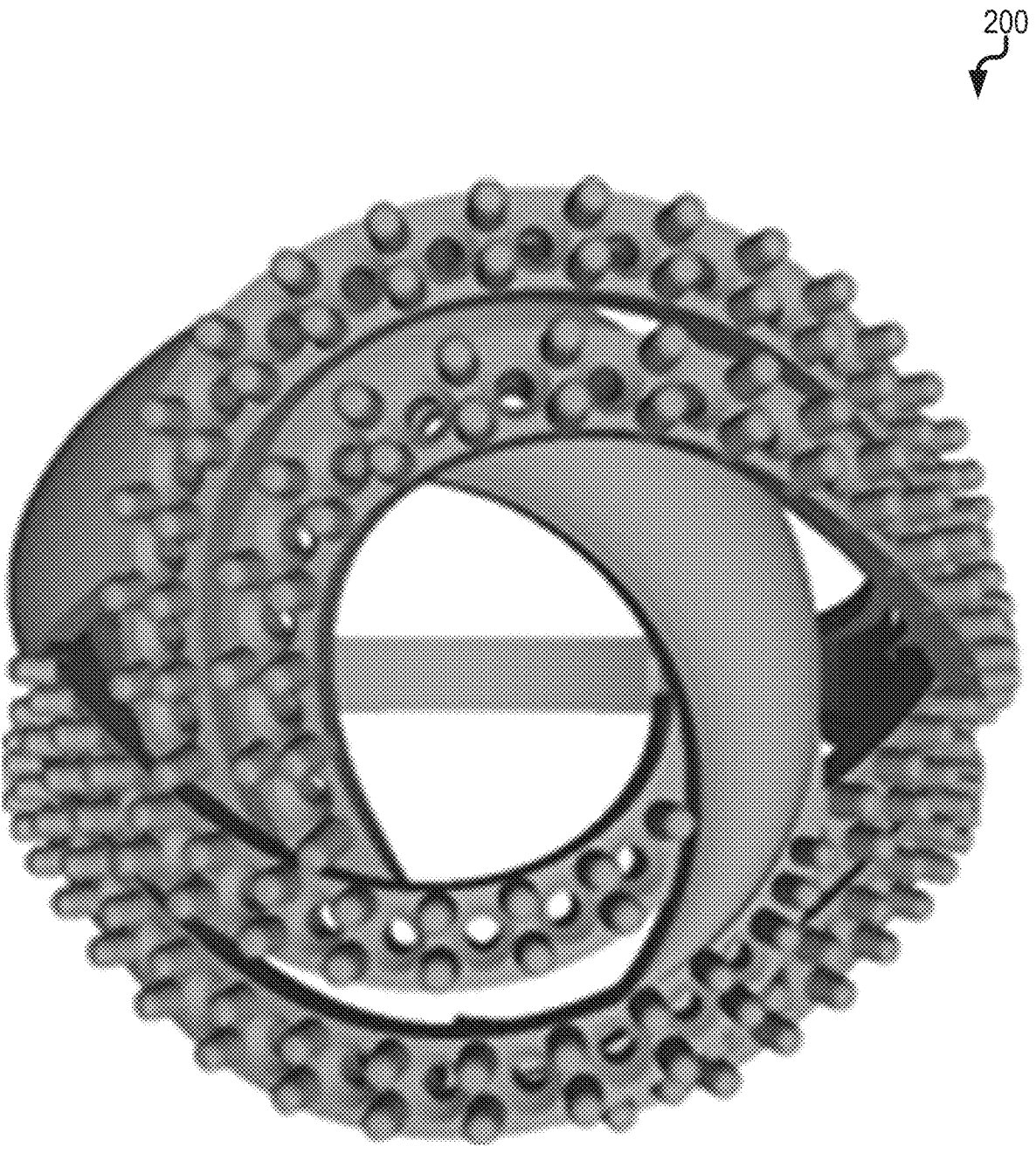
FIG. 2 is a rendering of an object generated using a first CAD file.
Figure 3:
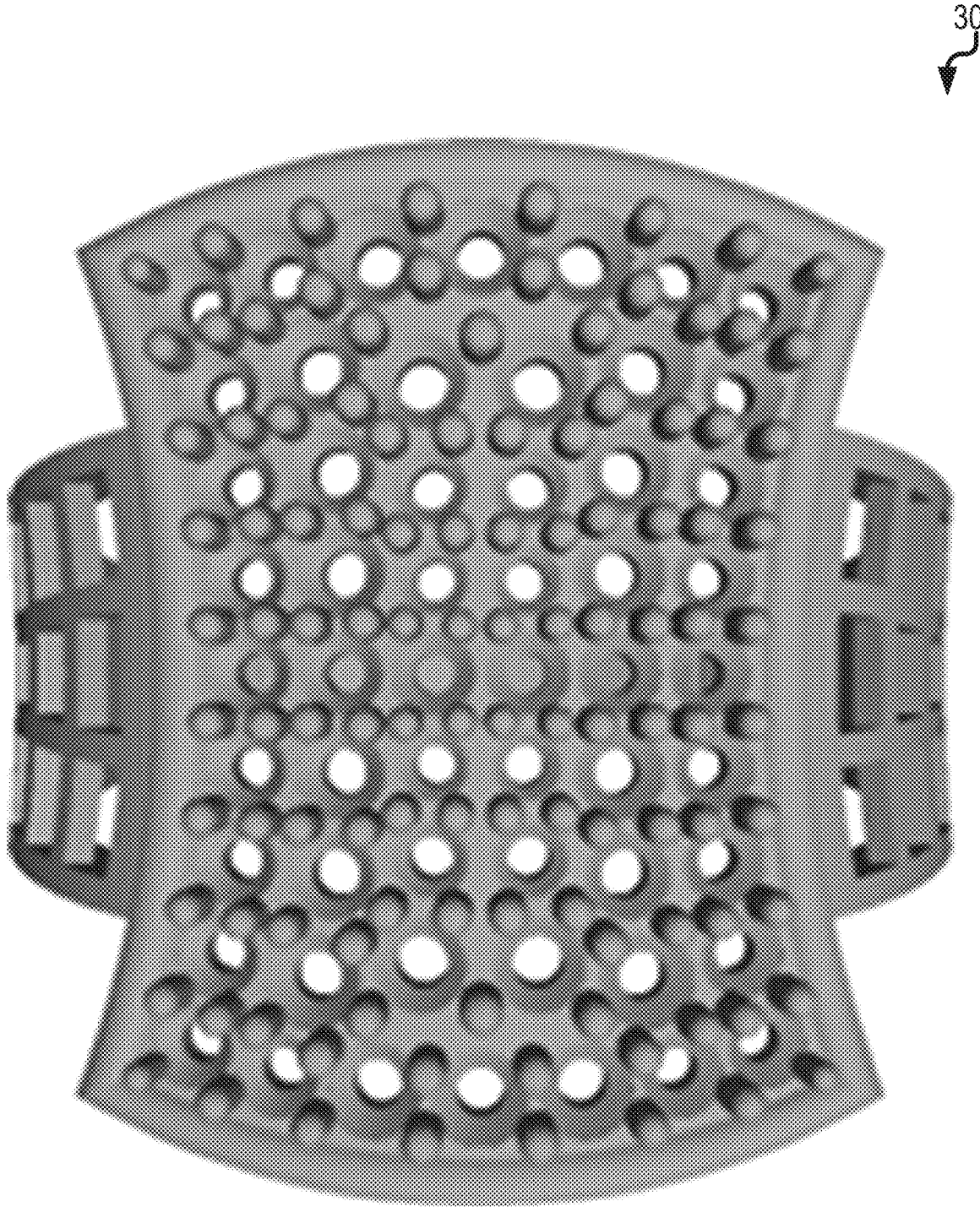
FIG. 3 is a graphical user interface rendering of an object generated using a second CAD file.

An example graphical user interface rendering of a first 3-D model from a first CAD file is seen in FIG. 2 and an example graphical user interface rendering a second 3-D model from a second CAD file is seen in FIG. 3. While these figures describe and visualize jewelry (i.e., rings) and are derived from STL files, it will be appreciated that the current subject matter is applicable to a wide variety of physical objects being modeled or otherwise characterized using a CAD platform.

The script, at or before 120, can perform additional segmentation of one or more of the loaded 3-D models. Segmentation, in this context, can provide for one or more 3-D models being divided into smaller parts based on geometric features, material properties, or other specific criteria. Segmentation can generate additional mesh objects from the previously loaded, standardized meshes of the one or more 3-D models. Segmentation can enable or otherwise allow for targeted adjustments to the one or more models without impacting their overall geometry, thereby enhancing design flexibility. Segmentation can advantageously reduce the occurrence of alignment issues (at 130) by, for example, eliminating overlapping geometric features between two or more meshes. Overlap as used herein is defined as the unintended intersection or crossing of features from two or more meshes after they have been aligned. Overlapping features can cause issues in the final model, such as visual artifacts, structural weaknesses, or errors in 3-D printing. By reducing overlap between very fine features of a mesh, segmentation can enable more complex designs and combinations thereof. Inversely, in some implementations, segmentation can also be used to reduce the number of polygons that include a mesh (i.e., mesh simplification), which can reduce processing demands and improve efficiency while preserving the overall shape and details of the associated 3-D model.

The 3-D meshes, at 120, are analyzed and key features are extracted from each. The script can include or otherwise execute AI algorithms that are trained to analyze the geometric properties of both a 3-D mesh as whole and as a collection of key features encompassed by the 3-D mesh. With respect to analyzing the 3-D mesh as a whole, the analysis can involve identifying the centroid and orientation of the 3-D mesh, which is useful for alignment and positioning tasks that occur at 130. In addition, the script can also be programmed to calculate the size, surface area, and enclosed volume of the 3-D mesh, which can be important for applications in manufacturing, 3-D printing, and simulations. Further, the script can determine the axis-aligned bounding box or convex hull of a mesh, aiding in spatial analysis and collision detection.

Key features of a 3-D mesh can include significant substructures, topographic contours, functional elements, and/or topological characteristics that are considered relevant for merging. With the example of 3-D meshes being directed to jewelry rings, the script can analyze the geometric properties of each ring, such as vertices, edges, faces, etc., to extract key features such as, but not limited to, the band design, ornamentation, and engravings, and subsequently determine the spatial characteristics of each. The analysis of each key feature can include any and all of the analyses that can be applied to the 3-D mesh as a whole. In addition, the script can be programmed to determine the relative positioning and orientation of each of the key features within the 3-D mesh as a whole.

The AI algorithms executed by the script can be employed in the analysis and extraction of key features and be specifically trained to recognize certain key features of a 3-D mesh, such as functional elements. In some variations, the AI algorithms can be trained in an unsupervised setting to detect key features based solely on the relative similarities and differences in the geometries of the plurality of 3-D meshes to be combined. Other AI algorithms can employ a combination of these and/or training strategies.

Once extracted, one or more of the key features can be treated as distinct components (e.g., isolated). The script can perform targeted operations on these isolated features, such as precise alignment or merging with corresponding features from another 3-D mesh. In some variations, isolated features are effectively treated as distinct mesh objects, while retaining their relational and spatial properties relative to the 3-D mesh as a whole. Of note, the analysis, extraction, and isolation of key features need not necessarily be performed in that order. In particular, the operations at 120 can be sequential or not, interpolate one and other, and/or iterate multiple times before progressing to 130.

The meshes, at 130, are positioned and aligned within 3-D space. Using automated methods, the script can apply geometric transformations such as translations, rotations, and scaling to position and align all key features to be incorporated within the final design, thus ensuring an optimal arrangement without the need for manual intervention. These operations ensure a proper fit during the merging process, at 140, such that the key features are correctly positioned and do not overlap or obscure each other. Proper alignment can be crucial for avoiding the formation of weak points or unnecessary stress concentrations that undermine the structural integrity of the final combined model, as well as for ensuring that the merged features function correctly, whether for aesthetic purposes or in practical applications like 3-D printing (through, for example, an additive manufacturing process, etc.).

The script can include or otherwise execute AI-driven techniques that can be used to apply transformations to 3-D meshes as a whole, such as by applying translations to align the centroids of two or more of the plurality of meshes, or rotations to match the overall orientations of the meshes. The script can be programmed to apply transformations only to the constellation of isolated features associated with the 3-D mesh, ignoring or discarding those mesh portions that are not part of an isolated or key feature. In addition, one or more isolated features can undergo transformations independently of the other isolated features.

To correctly align two or more 3-D meshes, the script can calculate the spatial difference between the centroids of the two or more meshes (or their constellations). These differences can be used to generate translation vectors, which are then applied to one or more of the centroids to move it into alignment with the others. The purpose of this translation is to ensure that the centroids are correctly positioned along the X, Y, and Z axes, occupying the correct coordinates relative to each other. Alternatively, the script can calculate the spatial differences between isolated features that correspond between two or more meshes (or their constellations). With some variations, the centroids of the isolated features themselves can be used. These spatial differences can be used to generate translation vectors, which are then applied to one or more of the isolated features to move it into alignment with its corresponding isolated feature belonging to a different mesh or constellation.

To correctly orient two or more 3-D meshes, the script can rotate a mesh, constellation, or isolated feature around one or more axes to either match or pair with the orientation of a corresponding mesh, constellation, or isolated feature. The axis of rotation of a mesh or constellation can contain the centroid of the mesh or constellation. The axis of rotation of an isolated feature can contain the centroid of the isolated feature. The script can calculate a specific axis of rotation to achieve a particular orientation of one or more key features, or calculate multiple axes of rotation if a sequence of rotations must be performed to achieve a particular orientation of one or more key features. The script can also be configured to determine the necessary angle(s) of rotation by comparing the orientations of the two or more corresponding meshes, constellations, or key features. A rotation matrix can then be applied to align the orientations, ensuring that the key features are not only positioned correctly but also oriented in a way that allows them to be seamlessly merged as desired. Such an arrangement is particularly useful for features with directional or symmetrical properties, such as band design.

Achieving proper alignment of a plurality of 3-D meshes can also include managing overlapping faces and vertices that could otherwise lead to invalid manifold geometry, which is particularly problematic for 3-D processing and printing applications. Mitigating the occurrence of invalid geometries can include virtually superimposing and/or testfitting the 3-D models to create a composite that predicts structural issues. Distances can be calculated between the surfaces of the superimposed meshes to quantify their alignment. Small distances indicate tight alignment, while larger distances can suggest misalignment that requires adjustment. The script can also be programmed to perform a wide range of geometric analyses to ensure the integrity and compatibility of the aligned meshes, including those analyses at 120. For example, the script can perform a bounding box analysis to evaluate the spatial limits of each mesh using axis-aligned bounding boxes (AABB) for faster spatial checks and oriented bounding boxes (OBB) for tighter fits that are also aligned with the mesh orientation. As another example, the script can calculate the surface area and enclosed volume of each mesh to verify that the combined geometry meets design specifications and to identify discrepancies that can arise during merging. As yet another example, automated algorithms can be utilized to detect intersections or overlapping regions between the meshes.

The script, at 140, combines the meshes by merging the key features into a single cohesive design. This operation can involve creating a new mesh object that integrates the key and/or isolated features from each original, component mesh in order to create a unified structure without leaving out any important details. This process can include concatenating the vertices, edges, and faces of each of the aligned features that correspond with each other, ensuring smooth and/or seamless transitions between components while preserving the structural integrity of the new mesh object. Merging can additionally or alternatively include amalgamating features from different component meshes to create a hybrid feature in the new mesh object. The relative degree (i.e., weighting) to which distinctive features from each component mesh are preserved can be user-customizable depending on the application. Aligned features can be merged using Boolean operations such as, but not limited to, a union operation that merges and/or glues two or more meshes into one, an intersection operation that retains only the common surface areas and/or volumes between meshes, and a difference operation that subtracts the surface area and/or volume of one mesh from another to remove a specific part. 3-D meshes can be virtually mated with each other in-alignment and then combined by merging vertices that are close together and filling any remaining small gaps. In addition, the script can provide users, by way of a graphical user interface, the option to directly manipulate the vertices, faces, and/or other geometric properties of the aligned features, including by adding, removing, and/or otherwise modifying the vertices, faces, and/or other geometric properties.

The script, at 150, can perform a detailed integrity check on the resultant mesh to detect any defects (e.g., overlapping faces, non-manifold edges, holes, etc.) that could have occurred. The script can include or otherwise execute a library of various functions to detect defects in the mesh, as well as a repair module that can automatically resolve defects to ensure that the final mesh is, for example, watertight and/or suitable for 3-D printing or simulations. The library can perform mesh cleaning including identifying and removing, for example, duplicate faces or stray vertices that are not connected to any face. In addition, the library can automatically fill holes and/or provide the user with tools to fill holes, as well as detect and repair non-manifold edges that could obstruct 3-D processing tasks. It should be noted that mesh cleaning and repair need not only be performed, at 150, but can be implemented throughout any and all of the preceding operations. Likewise, any repairs that involve merging or re-merging can utilize any and all of the techniques applicable to 140.

After performing necessary repairs, the script can perform various refinement operations, including applying one or more smoothing algorithms, to enhance the final design. These refinement operations can improve the quality of the combined model, preparing it for 3-D printing or further modifications. Various smoothing algorithms can be applied to ensure a high-quality surface. For instance, Laplacian Smoothing can be applied to move each vertex of the combined model toward an averaged position of its neighboring vertices, effectively reducing noise and creating smoother surfaces. Catmull-Clark Subdivision can be utilized to add new vertices and further subdivide the mesh to refine the geometry, resulting in a smoother, more polished surface. Bilateral Mesh Smoothing can be applied to smooth the mesh surface while preserving sharp edges and other important details, which is particularly useful for retaining certain features, such as decorative engravings, while simultaneously improving the overall smoothness of the mesh. Taubin Smoothing can be used which offers an improvement over basic Laplacian smoothing by alternating between smoothing and inflating steps, which avoids shrinking effects and is particularly useful for maintaining the original shape of the mesh while still achieving a smooth surface. In addition, edge and feature sharpening can be applied after smoothing to enhance and/or recover important features or edges that could have become too soft as a result of the smoothing operations, thus ensuring that critical design elements remain visible in the final model.

Beyond smoothing, the script can include instructions to implement several other refinements to improve the quality and functionality of the final combined model, including the aforementioned mesh segmentation and/or simplification approaches. Automated methods can optimize the topology of the model to have a distribution of vertices and edges that is efficient and conducive to the intended use of the model, particularly for cases in which the model is intended to undergo physical stress, such as rings. Furthermore, the script can use the aforementioned Boolean operations to add or subtract elements from the model, such as by creating hollows, adding text engravings, or combining the mesh with additional elements. Surface texturing techniques can also be applied to add fine details such as, for example, a grainy or patterned finish, which can enhance the aesthetic appeal or functionality of the final design.

The script can evaluate the response of the combined model to a library of various simulated conditions and environments depending on the intended use of the final design, and can then automatically adjust the model or make user recommendations based on the response of the model. For example, the library can be used to detect collisions between different meshes or between a mesh and other geometric entities, which is useful in simulations and physical modeling. The library can also support ray tracing operations, allowing users to cast rays and detect intersections with the mesh, which is useful for rendering and visibility analysis. The library can generate two- and/or three-dimensional paths and curves on the surface of a mesh or in space, which is useful for applications like CNC toolpath planning or animation. As yet another example, the library can further be interoperable or can otherwise be integrated with popular visualization libraries, allowing users to render and view 3-D meshes interactively.

Figure 4:
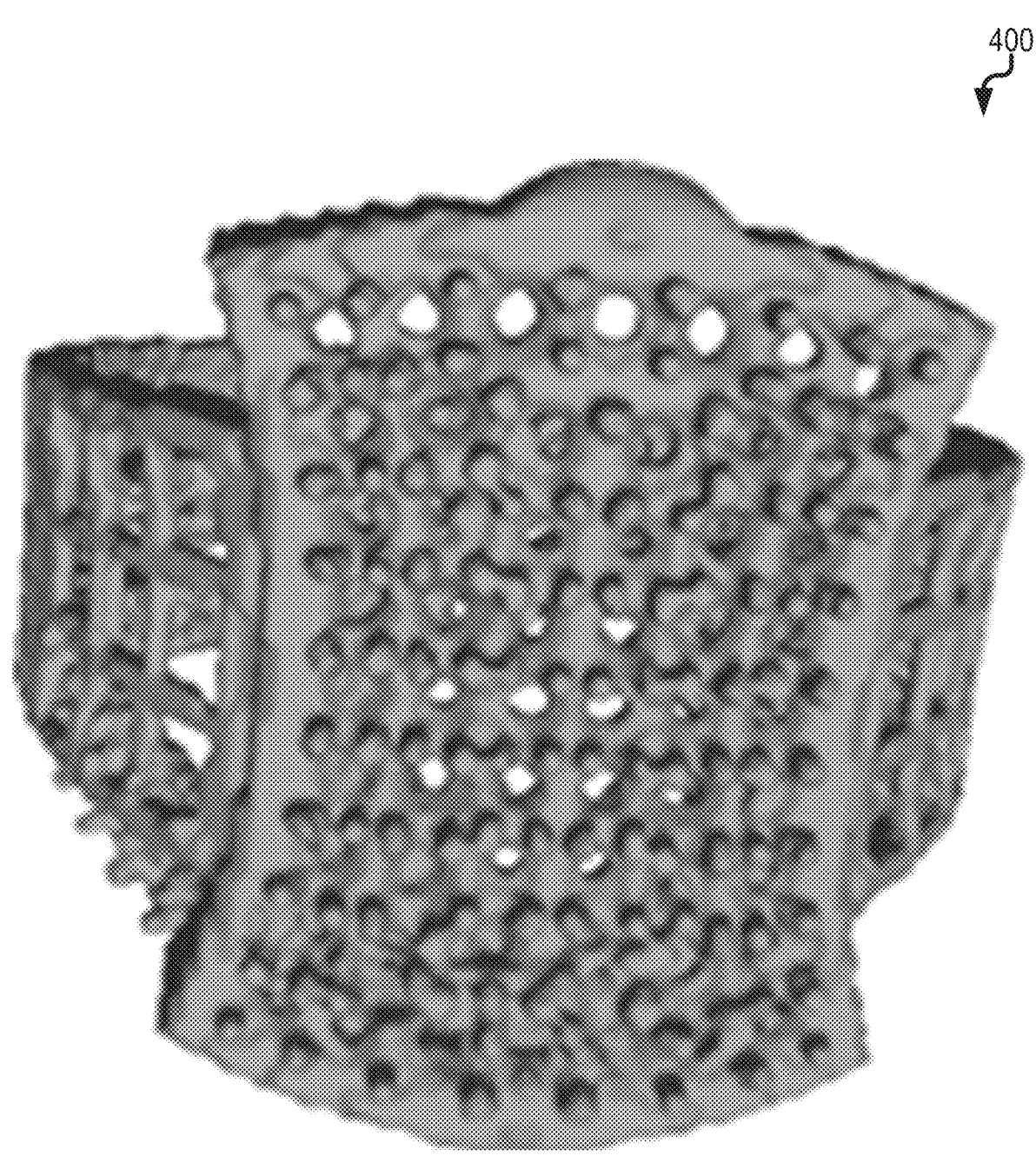
FIG. 4 is a graphical user interface rendering of an object generated as result of combining the first CAD file and the second CAD file.

Once the design has been refined, at 160, the final design can be exported as a new CAD file (e.g., STL file, etc.). This file can be configured for 3-D printing or additional adjustments using other 3-D modeling tools (e.g., computer-aided engineering platforms, etc.). For example, a library (e.g., Open3D) can be used to interconvert different file formats as required. Further simulation or physical analysis can be performed using the new CAD file. Further, the new CAD file can be used to manufacture some or all of the object represented in the new CAD file. FIG. 4 is an example graphical user interface view of the final design. This CAD file can then be used to build the represented physical object using, for example, one or more manufacturing systems which, for example, utilize 3D or other additive manufacturing processes.

The 3-D mesh data can be presented as inputs to the AI model, which can include one or more component layers, techniques, and/or architectures. For example, the model can include one or more encoders, which can be used to generate a compact representation of the input data so as to reduce its dimensionality (i.e., downsampling). Dimensionality refers to the number of variables and/or attributes recorded by a given dataset. For example, if a dataset were to be organized into a two-dimensional array of rows and columns, then the dimensionality would be analogous to the number of rows and columns. An encoder typically consists of a series of encoder layers that selectively let data pass through to the next layer. Within each layer of the encoder, the input data is partially discarded (or "forgotten"), which reduces the dimensionality of the input data as it passes through the neural network. The amount of data to be let through a given layer of an encoder can be determined by a sigmoid function which outputs numbers between zero and one. A value of zero can correspond to completely discarding all data prior to entering the next layer, while a value of one can correspond to passing all data along to the next layer (thereby retaining all input data).

BinaryShapeEncoder is a convolutional encoder layer that convolves voxel data encoding the 3-D mesh to create feature maps (i.e., 3-D arrays that summarize the presence and location of the features detected in the 3-D mesh). For example, this is particularly useful for compressing and simplifying 3-D object details (and/or encoding binary shape data of 3D objects) to generate latent feature representations (i.e., embeddings) for part segmentation. Within a given convolutional encoder layer, the overall 3-D mesh is separated into discrete regions of voxels. Each voxel that is part of the 3-D mesh can be assigned a uniform numerical value, for example. The convolution process can proceed by computing, for example, an inner product and/or weighted sum of the values (e.g., density of voxels) within a particular region to create a feature map. Then, the sampling frame can shift (according to a predetermined stride) so that it is centered around a new voxel, and the subsequent volume enclosed by the sampling frame can be resampled to create a new feature map. Depending on the stride, feature maps can, for example, overlap with some of the voxels bounded by the previous sampling frame location. Therefore, the convolution inherently oversamples data as it revolves around a given voxel or origin point, according to this example. Through this and other processes, the AI model extracts features and/or topographies of the 3-D mesh. The features can include, for example, a plurality of edges, vertices, shapes, and other geometric objects.

Alternatively, or in addition to the previous example, one or more convolutional layers can contain a set of filters, which includes of one or more matrices of parameters that are learned through training and applied to the 3-D mesh input, allowing for the generation of feature maps. Specifically, these filters can iterate through the 3-D mesh and can downsample and/or reduce dimensionality of a layer input by, for example, imputing a set of summary statistics (e.g., average, min/max, global average, global min/max, etc.) that are descriptive of the numerical distribution of a given feature map (i.e., "flattening"). For example, a 3-D convolutional encoder can be configured to extract features from 3-D shape data conforming to a dimensional array and/or tensor format of [B, H, W, D, C], where B is the batch size, H, W, and D are spatial dimensions, and C is the number of channels. Other techniques for downsampling include, for example, principal component analysis (PCA), linear discriminant analysis (LDA), and t-distributed stochastic neighbor embedding (t-SNE). As a result of the downsampling, the size of the feature maps can decrease throughout a series of 3-D convolutional layers, for example, as the outputs of previous layers are taken as input to subsequent convolutional layers.

The resultant output (i.e., the surviving data, activation signals, etc.) of a series of convolutional layers can be presented to a scoring neural network, which contains dense nodes with parameters that are learned through training. A rectified linear unit (ReLU and/or "Leaky" ReLU) activation function can be used, for example, to pass the activation signals through the neuron layers within the scoring neural network to output latent embeddings. Activation functions can also be used to introduce non-linearity into the network, which can enable the network to learn complex patterns and representations.

The AI model can also include one or more decoder layers, which can receive the downsampled dataset (i.e., the latent embeddings that preserve the intrinsic features of the input data) and produce a reconstructed dataset (i.e., feature map) that approximates the original input data. Reconstructed datasets need not be identical to their original counterparts; rather, reconstructed datasets can be intended to emulate key features that occur throughout the input dataset to a predefined level of accuracy. During training, the performance of the decoder can be evaluated based on its ability to recreate the input dataset. The decoder can, for example, attempt to reconstruct the original input from through an inverted mechanism to that of the convolutional layer(s). For example, the original dimensionality of the dataset can be gradually restored (i.e., "upsampled") as the data progresses through successive decoder layers. For example, information originally stored within an array having the dimensions of 16×16×2 can be compressed to an array having the dimensions of 8×8×2. A decoder can restore the dimensionality of this dataset to 16×16×2 by applying the data-patterns that were learned during training to predict the missing values in the compressed dataset. Upsampling can be performed by using, for example, deconvolutional layers and/or transposed convolutional layers.

Thus, by accurately interpolating datapoints within the encoded part representations that are consistent with latent key features, a SharedPartDecoder will generate reconstructed parts (i.e., datasets) encompassing 3-D volumes that conform closely to their original or modified 3-D shapes and/or cubic volumes. Upsampling can also be utilized to increase the resolution of data, such as enlarging an image or voxel grid. An output layer and/or final scoring neuron can also apply a sigmoid activation function to the resulting reconstructed part to determine a numerical score (ranging from 0 to 1, for example) indicating the probability that the reconstructed part is classifiable as a particular shape and/or semantically-classified part stored within a reference library or associated with binary part segmentation tasks. In addition, SharedPartDecoder can utilize, for example, transposed convolutions (i.e., Conv3DTranspose), batch normalization, activation functions, dropout layers, or any combination thereof, to upsample the features and reconstruct their shapes.

During downsampling and upsampling processes, relevant features including, for example, fine-grained spatial information and/or small details (edges, boundaries, textures, etc.) can become lost and/or distorted. Skip connections (i.e., residual connections) can be employed by the model to preserve information by directly linking non-adjacent convolutional layers together, thus enabling earlier layers to pass their outputs (i.e., feature maps) directly to later layers. For example, detailed information on low-level features (e.g., surface texture) can be forwarded from an encoder layer to a decoder layer storing information on high-level features, for example, which can help to ensure that details about low-level features are retained by the trained model. This could also be performed in reverse during backpropagation. As another example, skip connections can behave like shortcuts that add one or more inputs of a layer directly to the output of that layer, thereby bypassing non-linear transformations that would otherwise be performed on those inputs. Preserving spatial information across layers can be particularly relevant during upsampling processes within network models designed for tasks such as image segmentation, super-resolution, or other tasks that involve restoring and/or generating high-resolution data from low-resolution input data. Skip connections can also be applied between one or more different layers to combine feature maps from the different layers and create shape variations in the final 3-D mesh outputs.

A neural network can also preserve spatial details by incorporating dense blocks, wherein one or more layers receive information directly from multiple layers preceding it, as opposed to only receiving information from the immediately preceding layer. For example, a model could be configured such that each layer receives the output of every layer preceding it, or such that the model contains one or more fully connected layers, wherein each neuron in a layer connects to every neuron in a succeeding layer. Skip connections and/or dense layers can help the model avoid and/or resolve problems stemming from the bias-variance tradeoff, including, for example, underfitting, overfitting, and the vanishing gradient problem. In addition, skip connections and/or dense layers can help the model converge faster by providing direct pathways for gradients during training, as well as enable the model to better generalize from unseen data by preventing overfitting to certain layers.

In addition to encoder and decoder layers, the AI model can include of one or more additional layers as well, including, for example, a projection layer. The projection layer can reduce the features generated by the BinaryShapeEncoder into a smaller dimensional space which, for example, can be used for projection purposes, improve model performance, enable faster training, and/or perform part-wise analysis. A projection layer can include, for example, a simple fully connected layer. As another example, a decomposer layer can be utilized to combine the BinaryShapeEncoder and one or more projection layers to decompose the 3-D input shape into multiple parts. Similarly to a convolutional layer, the decomposer can output a tensor of a given part contains, for example, B (batch size), num_parts, and encoding_dimensions that represent the features of the given part. As another example, a LocalizationNet layer can be added to the AI model to ensure precise placement of reconstructed, 3-D parts following decoding.

This layer can process both stacked inputs (i.e., a plurality of discrete 3-D shape features) and summed inputs (an aggregation of 3-D shape features) to produce the final transformation matrix for each reconstructed part, which aligns and/or orients the part relative to the other parts by applying one or more affine and/or ridged-body transformations in 3-D space. The LocalizationNet can output a transformation matrix for each reconstructed part to generate transformed feature maps, which in turn can be used by a subsequent resampling layer to, for example, generate the final part shapes.

The resampling layer can correct misalignments or imperfections in reconstructed parts by accepting outputs from both the transformed feature maps (input_fmap) and the transformation matrices from the LocalizationNet layer. The resampling layer then outputs 3-D grids using one or more affine transformation matrices and applying trilinear sampling to resample the input feature map to the desired coordinates, thereby interpolating missing values and texture smoothing the resultant shape. As yet another example, the AI model can incorporate one or more attention mechanisms throughout the model architecture (e.g., encoder-decoder, CNN, LSTM, U-Net, etc.), which can prioritize significant shape features and/or deprioritize insignificant shape features during reconstruction.

In addition to having a variety of different layers and connection patterns, the AI model can further include a plurality of segments and sub-models. A Transformation Prediction Model (TPM), for example, can perform a specialized role within the overall AI model architecture by predicting the rigid body transformations (e.g., rotations, scaling, translations, etc.) and/or affine transformations required to accurately assemble the plurality of 3-D parts. The TPM model can learn to map input features (such as images, voxel grids, etc.) to, for example, the twelve different transformation parameters representing a 3×4 affine transformation matrix, wherein each parameter corresponds to a combination of scaling, rotation, shearing, and translation operations applied to a 3D point in space.

The TPM can include any of the layers and/or components available to the AI model. For example, a TPM can optionally include an attention mechanism to focus on significant regions in the 3D tensor. A TPM can also benefit from containing an encoder part followed by dense layers for regression of transformation parameters.

As another example, the AI model can include a Shape Reconstruction Model (SRM) that is dedicated to reconstructing a complete 3-D object from segmented parts and their associated transformations. The SRM can, for example, receive and combine outputs from the PartDecoder and the TPM together by applying the predicted transformations to the reconstructed parts output by the PartDecoder. The SRM can include deconvolution layers can be applied to merge the plurality of segmented parts into a coherent whole. The SRM can further include a final layer configured to output a dense, 3-D shape. Ultimately, according to this example, latent features from decomposed shapes are recombined, shuffled, and transformed by the AI model to generate new 3D designs using the a combination of the aforementioned exemplary features. By probabilistically sampling different parts of the latent space (i.e., embedding space), the model can randomly select different geometric features that have been captured within the compressed space and use them to generate different variations of the same object. For example, by applying affine grids and trilinear interpolation, the model can produce variations in how a 3D object is shaped or oriented. Introducing variability can produce effects ranging from only slight changes in the position or form of the final 3-D object, to drastic differences even despite overall similar inputs.

Depending on the number and complexity of 3-D meshes to be analyzed and combined, an ensemble of neural networks can be preferable to any single neural network. Single neural networks can be vulnerable to overfitting, underfitting, vanishing gradients, and/or achieving suboptimal error minimization. By comparison, a holistic, multi-network approach can be better equipped to overcome problems related to bias and variance and achieve a more optimal result. The collaborative ensemble of networks can be connected and organized in a variety of ways. In some embodiments, multiple neural networks can be configured to operate in parallel, series, or within some higher-order network architecture depending on the optimal arrangement for the process.

During a first training phase, the AI model can learn to segment and/or reconstruct parts of the 3-D object. Under a supervised training regimen, for example, the training dataset can be manually segmented and/or labeled according to distinct shapes and/or geometric features that represent ground truth. The labels themselves can include annotated metadata in JSON format, for example. The dataset can also be divided according to higher-order shape classifications, such as rings. The training dataset can consist of, for example, one hundred 3-D objects for each class the AI model is trained on. During a second training phase, the AI model can learn how parts of the 3D object transform (e.g. translate, rotate, scale) over time or under different conditions. The AI model can, for example, be configured to optimize face-wise and/or edge-wise accuracy of overlayed and/or recombined parts. A library can be used to provide references for dihedral angles between adjacent faces of two or more parts to be recombined or overlayed. During a third training phase, the AI model can learn to perform part segmentation, transformation prediction, and shape reconstruction end-to-end and/or simultaneously.

The training data can include of 3-D objects represented in a tensor format of [B, H, W, D, C], where B is the batch size, H, W, and D are spatial dimensions, and C is the number of channels. 3-D objects for training can also be preprocessed into voxel grids of a uniform resolution (e.g., 64×64×64). Statistical normalization and/or standardization techniques (such as min-max scaling) can be applied to the dataset, including 3D input, encoding parts, and/or transformations, to improve the overall performance and/or efficiency of the neural network and facilitate better learning. Batch normalization can also be applied at least during the first training phase, which involves adjusting and/or scaling activations of one or more layers to ensure that they have a predetermined mean and/or variance across a batch of training data. This can help maintain a stable distribution of activation values throughout the training process, which can prevent issues such as vanishing or exploding gradients. In addition, the model can be trained using unseen transformations wherein, for example, random affine and/or rigid-body transformations are applied to a training dataset in order to expose the model to an expanded variety of possibilities. To further hone the ability of the model to generalize, for example, unseen transformations can be unlabeled.

During the first training phase, the BinaryShapeEncoder can be trained to perform part segmentation using binary cross-entropy loss on part-wise segmentation labels. In this example, part segmentation at least refers to encoding binary shape data (i.e., the presence or absence of parts within one or more meshes). The PartDecoder can be trained alongside the Binary ShapeEncoder during the first training phase. The PartDecoder can be trained to decode latent representations into 3-D parts using, for example, part-reconstruction loss and/or pi loss. In this example, part-reconstruction loss at least refers to a measurement of how well the predicted parts match the ground truth, and pi loss at least refers to regularization for projections to ensure consistency between different parts.

Together, the BinaryShapeEncoder and PartDecoder are trained as an autoencoder for part segmentation. The pre-trained encoder weights are forward-propagated and/or reused in subsequent tasks, ensuring that the part segmentation knowledge is transferred to later stages. The training of both the BinaryShapeEncoder and the PartDecoder can be fine-tuned during at least the third training phase to integrate and/or ensure consistency with transformation prediction and shape reconstruction.

During the second training phase, the Transformation Prediction Model (TPM) can be trained to regress transformations of part embeddings from the pretrained BinaryShapeEncoder using transformation loss as a loss function. In this example, transformation loss measures how well the predicted transformations (e.g., geometric deformations) align with the true transformations. Alternatively, transformation loss can refer to the Euclidean distance (i.e., L2) between predicted and ground truth transformation parameters. In addition, an attention mechanism can be employed that focuses on important regions of the 3-D data for predicting transformations. Important regions can include, for example, regions that are relevant for making accurate transformation predictions, such as boundary regions of the 3D object (e.g., the edges of a ring). These areas can contain critical information for alignment or deformation. Other important regions can include regions with high levels of geometric detail that may require more attention to ensure that transformations are faithfully executed, such as sharp features or fine details that require precise movement. As another example, joints and/or connections between parts that require special handling while undergoing transformations can be considered important regions, such as a joint between different body parts or the connection between cloth and body in a physical simulation. The attention mechanism assigns higher weight to these important areas, ensuring that the model at least allocates sufficient resources towards predicting their transformations.

The parameters of the attention mechanism can be regularized using Attention Consistency (AC) loss, which encourages the attention mechanism to produce consistent and meaningful attention weights across different layers of the model. This can help ensure that the model focuses on the same important regions at various stages of processing, which prevents the model from "shifting" its focus inappropriately. The training of the TPM can be fine-tuned during at least the third training phase to align transformation predictions with the other segmentation and reconstruction tasks, for example.

During the third training phase, the Shape Reconstruction Model (SRM) can be trained to regress transformations of part embeddings from the pretrained BinaryShapeEncoder using transformation loss as a loss function. In this example, transformation loss measures how well the predicted transformations (e.g., geometric deformations) align with the true transformations.

Additionally, during the third training phase, all components of the AI model's pipeline can be trained end-to-end and/or simultaneously. Therefore, gradients from the shape reconstruction task can be backpropagated and/or configured to influence segmentation (via BinaryShapeEncoder) and transformation (via attention and projection), ensuring joint optimization (as opposed to being optimized independently of each other). For example, during the third training phase, the PartDecoder can adapt to changes in latent representations caused by transformations. All components are fine-tuned iteratively, using a unified loss to improve compatibility and accuracy.

Additionally, aforementioned loss functions of the components can be utilized during the third training phase, including one or more combinations of reconstruction loss, transformation loss, and shape reconstruction loss (which measures fidelity of the reconstructed shape). Pi loss can also be used to regularize projections, and AC loss can be configured to encourage alignment of attention across layers if attention mechanisms are used. Custom loss functions can also be utilized to ensure accurate decomposition, high reconstruction fidelity, and adherence to the original object's characteristics.

In addition, the AI model can utilize a parameter optimization framework, allowing for the systematic and automatic optimization of training variables. This can help to significantly reduce the down-time of training cycles by improving the training efficiency of the network. Hyperparameters such as learning rate (measure of how rapidly the model moves to the minimum achievable error) and the number of layers can be chosen and fine-tuned. Additionally, there are refinement steps that can be further incorporated to facilitate the generation of a manufacturable 3-D object file, including: (1) expanding the training dataset to improve model performance and result quality; (2) applying smoothing techniques to enhance the surface quality of 3-D objects; and (3) enhancing labelling tools and/or annotation accuracy to improve training and reconstruction outcomes.

The following example processes (A-E) collectively embody further mass-production and commercialization capabilities of the techniques disclosed above.

Example A is a process for mass product customization. In Example A, superimposition techniques are utilized to ensure that each of a plurality of customized product aligns perfectly with a base product design, making it possible to produce numerous personalized products at scale without distorting the base design or its underlying structure. The first step can consist of voxelizing a base model used for mass production. The second step can involve applying rigid body transformations to align custom and/or personalized elements with the base model. With the example of 3-D meshes being directed to jewelry rings, the base model can include a ring band, and the custom and/or personalized elements can consist of gemstones and/or engravings. An optional third step can involve using a non-rigid transformation to adjust the custom element to fit the surface of the base model. Finally, this process can be repeated for each customized item to ensure precise alignment in mass production.

Example B is a process for prototyping and iterative design. Example B enables a designer to visualize how changes in structure affect the appearance and functionality of a product, which has an ultimate effect of aiding in selecting the optimal design for production. The first step can involve creating multiple different design variations such as, with the example of jewelry, different configurations of a gemstone setting or pattern. The second step can consist of superimposing these design variations onto a base model using voxel-based transformation. During the third step, the designer (with or without the assistance of AI) analyzes differences in the aesthetic appearance or functionality between the design variations superimposed onto the base models. In the fourth step, the designer finalizes the design based on comparison and feedback.

Example C is a process for applying custom intricacies and decorations onto the surfaces of products. Example C ensures that intricate and/or decorative elements are aligned correctly on a curved and/or irregularly-shaped surface of a base product model, which has an ultimate effect of enhancing the appearance of the product. The first step can involve creating or selecting a base model. The second step can consist of designing an intricate and/or decorative element (e.g., an engraving pattern) that is stored as a separate CAD file (such as an STL file). In the third step, the intricate and/or decorative element can be superimposed onto the base model using rigid body transformations to align the mesh that represents the decorative element with the curvature of the base model. An optional fourth step can involve applying non-rigid transformations to the resultant combination to ensure that the intricate and/or decorative element fit and/or conform to the surface of the base model precisely and without distortion.

Example D is process to produce functional designs with moving components. Example D ensures that the mechanical parts of a product or product component (e.g., a rotating band on a wedding ring or locket mechanism) moves smoothly and functions as intended without getting stuck or misaligned due to a faulty underlying structure. This first step can involve voxelizing both the stationary (i.e., base model) and moving components. The second step can consist of superimposing the moving components onto the base model using rigid body transformations. The third step can involve applying non-rigid transformations to resolve any resultant areas where the components might interfere with each other. In an optional fourth step, movement of the superimposed, moving components can be simulated to verify that the components operate without obstruction.

Example E is a process for generating and superimposing individual CAD files. Example E ensures that different design variations are compatible such that they can be superimposed for alignment, comparison, and final adjustments before production. The first step can involve generating individual CAD files for each custom component or base model included in a production line. The second step can involve using rigid and/or non-rigid transformations to align and layer each CAD file onto the base model. The third step can consist of making necessary adjustments to ensure that the final design is cohesive and meets the desired aesthetic or functional requirements.

Figure 5:
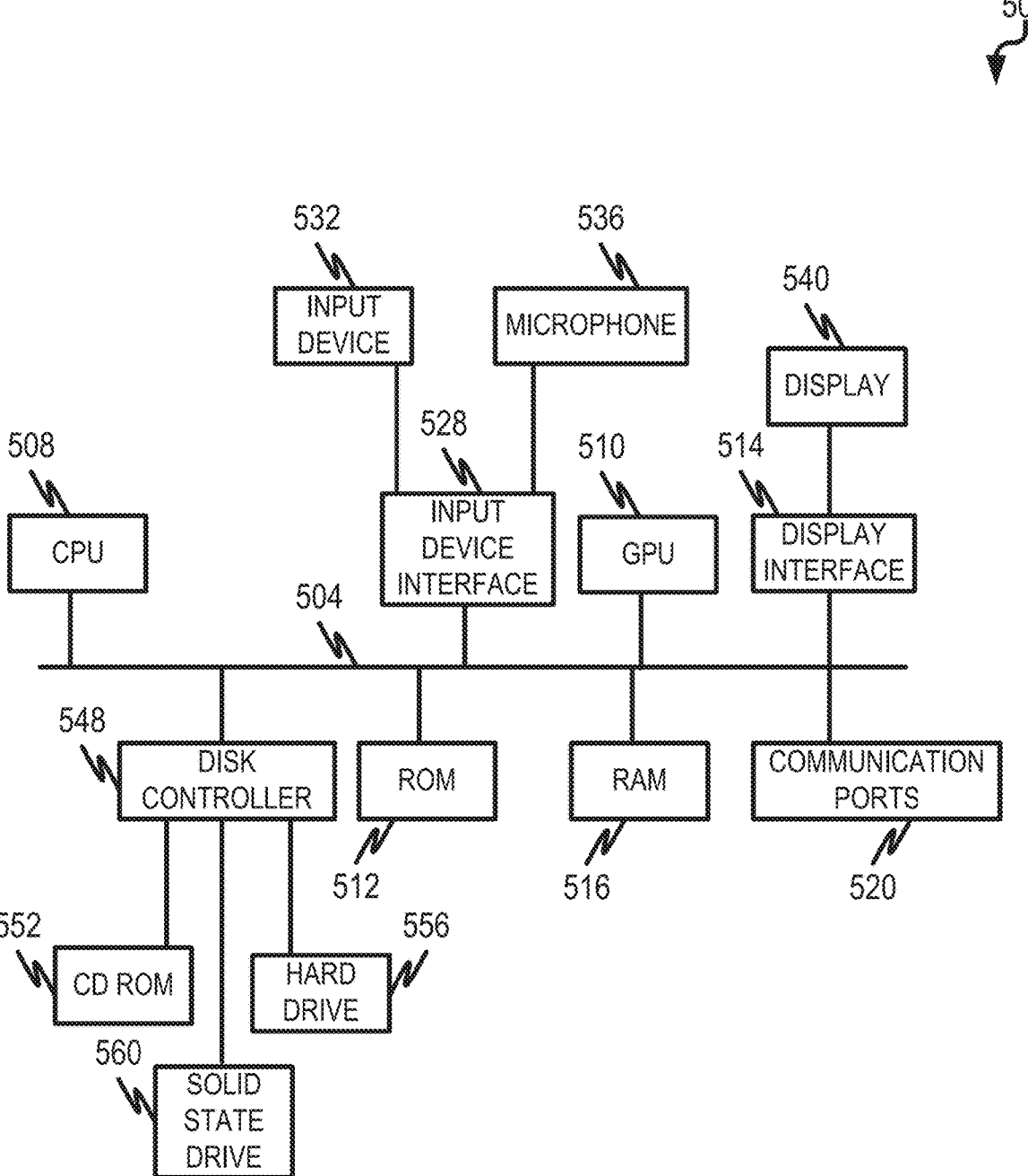
FIG. 5 is a diagram illustrating aspects of a computing device to implement the current subject matter.

FIG. 5 is a diagram 500 illustrating a sample computing device architecture for implementing various aspects described herein. A bus 504 can serve as the information highway interconnecting the other illustrated components of the hardware. A processing system 508 labeled CPU (central processing unit) (e.g., one or more computer processors/data processors at a given computer or at multiple computers), can perform calculations and logic operations required to execute a program. In addition, a processing system 510 labeled GPU (graphics processing unit) (e.g., one or more computer processors/data processors at a given computer or at multiple computers), can perform calculations and logic operations required to execute a program. A non-transitory processor-readable storage medium, such as read only memory (ROM) 512 and random access memory (RAM) 516, can be in communication with the processing system 508 and can include one or more programming instructions for the operations specified here. Optionally, program instructions can be stored on a non-transitory computerreadable storage medium such as a magnetic disk, optical disk, recordable memory device, flash memory, or other physical storage medium.

In one example, a disk controller 548 can interface with one or more optional disk drives to the system bus 504. These disk drives can be external or internal floppy disk drives such as 560, external or internal drive including solid state drives such as 552, or external or internal hard drives 556. As indicated previously, these various disk drives 552, 556, 560 and disk controllers are optional devices. The system bus 504 can also include at least one communication port 520 to allow for communication with external devices either physically connected to the computing system or available externally through a wired or wireless network. In some cases, the at least one communication port 520 includes or otherwise includes a network interface.

To provide for interaction with a user, the subject matter described herein can be implemented on a computing device having a display device 540 (e.g., an LED, LCD, etc. monitor) for displaying information obtained from the bus 504 via a display interface 514 to the user and an input device 532 such as keyboard and/or a pointing device (e.g., a mouse or a trackball) and/or a touchscreen by which the user can provide input to the computer. Other kinds of input devices 532 can be used to provide for interaction with a user as well; for example, feedback provided to the user can be any form of sensory feedback (e.g., visual feedback, auditory feedback by way of a microphone 536, or tactile feedback); and input from the user can be received in any form, including acoustic, speech, or tactile input. The input device 532 and the microphone 536 can be coupled to and convey information via the bus 504 by way of an input device interface 528. Other computing devices, such as dedicated servers, can omit one or more of the display 540 and display interface 514, the input device 532, the microphone 536, and input device interface 528.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system can include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A computer-implemented method comprising:
receiving two or more files each encapsulating a three dimensional (3-D) computer-aided design (CAD) model, the models each comprising a different mesh object;
isolating key features within two or more different mesh objects;
categorizing the isolated features as being associated with one of a plurality of different design elements;
superimposing at least portions from each of the two or more mesh objects to predict structural issues, the portions comprising the isolated features;

aligning, for each design element category common to the mesh objects, a first isolated feature from a first mesh object to a corresponding second isolated feature from a second mesh object by:
calculating centroids for each of the at least portions of the two or more different mesh objects;
generating a translation vector equal to a displacement between the centroids; and
using the translation vector to align the centroids;
resolving predicted intersections between aligned isolated features by locally modifying vertices of at least one of the isolated features prior to merging;
generating a new mesh object based on the two or more mesh objects by merging the aligned isolated features, wherein the merging comprises performing mesh refinement operations to ensure the new mesh object is watertight and free from non-manifold edges, and smoothing transitions between merged features;
performing structural integrity operations prior to and after merging including merging vertices within an epsilon distance, closing holes, and repairing non-manifold edges; and
providing the new mesh object to a consuming application or process.

2. The method of claim 1 further comprising:
converting the two or more files into the mesh objects prior to the isolation of the features of interest.

3. The method of claim 2, wherein the mesh objects store geometric information characterizing vertices, edges, and faces in a structured format.

4. The method of claim 1, wherein features which are not of interest are not isolated from the two or more different mesh objects.

5. The method of claim 1, wherein the aligning further comprises:
calculating a first centroid for the isolated feature from the at least one mesh object and a second centroid for the similar isolated feature from another mesh object;
causing the first centroid and the second centroid to be aligned.

6. The method of claim 5, wherein the causing comprises rotating the at least one mesh object about a third centroid.

7. The method of claim 1 further comprising:
mitigating intersection of features after the aligning.

8. The method of claim 1, wherein the generating of the new mesh object comprises:
performing one or more structural integrity operations prior to the merging to ensure that the new mesh object will be free from defects.

9. The method of claim 1, wherein the generating of the new mesh object comprises:
smoothing transitions between components, the components comprising sets of key features.

10. The method of claim 1, wherein the consuming application or process:
loads the new mesh object into memory, stores the new mesh object in physical persistence, transmits the new mesh object over a computing network to a remote computing device and/or causes the new mesh object to be displayed in a graphical user interface of a computer-aided design software program.

11. The method of claim 1 further comprising:
manufacturing a physical object based on the new mesh object.

12. The method of claim 11, wherein the manufacturing is performed by an additive manufacturing system.

13. The method of claim 3, wherein the merging further comprises:

concatenating the vertices, edges, and faces of aligned isolated features of a same design element category to ensure seamless transitions between component of the generated new mesh object, wherein the concatenation is performed by combining the geometric data of the aligned features and refining the transition region to minimize mesh distortion.

14. The method of claim 13, wherein the merging further comprises:

amalgamating isolated features from different mesh objects to create a hybrid feature in the generated new mesh object, the relative weighting of the amalgamated isolated features being user-customizable.

15. A computer-implemented method for generating a unified mesh object from multiple three-dimensional (3D) computer-aided design (CAD) models, the method comprising:

receiving at least a first file and a second file, each encapsulating a 3D CAD model that includes a different mesh object;

extracting and isolating key features from each mesh object and assigning, using at least one artificial intelligence model, each isolated feature to one of a plurality of design element categories;

superimposing only the isolated features from the first and second mesh objects to predict structural issues by computing inter-surface distances between the superimposed isolated features;

aligning, for each design element category common to the first and second mesh objects, a first isolated feature from the first mesh object to a corresponding second isolated feature from the second mesh object by: (i) computing a first centroid of the first isolated feature and a second centroid of the second isolated feature, (ii) generating a translation vector equal to the displacement between the first centroid and the second centroid, and (iii) translating the first isolated feature by the translation vector and optionally rotating the first isolated feature about its centroid to match an orientation of the second isolated feature;

resolving predicted intersections between aligned isolated features by locally modifying vertices of at least one of the isolated features prior to merging;

merging the aligned isolated features into a unified mesh object by concatenating vertices, edges, and faces that correspond to the aligned isolated features and filling small gaps so that the unified mesh object is watertight; and outputting the unified mesh object to a consuming application or process.

16. A system comprising:

at least one hardware processor; and memory storing instructions which, when executed by the at least one hardware processor, result in operations comprising:

receiving two or more files each encapsulating a three dimensional (3-D) computer-aided design (CAD) model, the models each comprising a different mesh object;

isolating key features within two or more different mesh objects;

categorizing the isolated features as being associated with one of a plurality of different design elements;

superimposing at least portions from each of the two or more mesh objects to predict structural issues, the portions comprising the isolated features;

aligning, for each design element category common to the mesh objects, a first isolated feature from a first mesh object to a corresponding second isolated feature from a second mesh object by:

calculating centroids for each of the at least portions of the two or more different mesh objects;

generating a translation vector equal to a displacement between the centroids; and using the translation vector to align the centroids;

resolving predicted intersections between aligned isolated features by locally modifying vertices of at least one of the isolated features prior to merging;

generating a new mesh object based on the two or more mesh objects by merging the aligned isolated features, wherein the merging comprises performing mesh refinement operations to ensure the new mesh object is watertight and free from non-manifold edges, and smoothing transitions between merged features;

performing structural integrity operations prior to and after merging including merging vertices within an epsilon distance, closing holes, and repairing non-manifold edges; and providing the new mesh object to a consuming application or process.

17. The system of claim 16, wherein the operations further comprise:

converting the two or more files into the mesh objects prior to the isolation of the features of interest.

18. The system of claim 17, wherein the mesh objects store geometric information characterizing vertices, edges, and faces in a structured format.

19. The system of claim 16, wherein the operations further comprise:

generating, by the consuming application or process, instructions to manufacture a physical object based on the new mesh object.

20. The system of claim 19, wherein the instructions to manufacture the physical object are transmitted to a three-dimensional (3D) printer to print the physical object.

21. The method of claim 15, wherein the superimposing comprises generating a signed distance field for the isolated features and identifying overlaps when distances fall below a threshold.

22. The method of claim 15, wherein the aligning further comprises determining a rotation by principal component analysis of point clouds of the isolated features to match principal axes prior to translation.

23. The method of claim 15, wherein resolving predicted intersections comprises performing Boolean operations limited to isolated features within a same design element category.

24. The method of claim 15, further comprising performing structural integrity operations prior to and after merging, including merging vertices within an epsilon distance, closing holes, and repairing non-manifold edges to ensure watertightness.

25. The method of claim 15, wherein the aligning is performed on constellations of isolated features by aligning centroids of corresponding feature constellations before aligning individual isolated features within the constellations.

* * * * *